*US008963258B2*

(12) United States Patent
Yu et al.

(10) Patent No.: US 8,963,258 B2
(45) Date of Patent: Feb. 24, 2015

(54) FINFET WITH BOTTOM SIGE LAYER IN SOURCE/DRAIN

(71) Applicant: Taiwan Semiconductor Manufacturing Company, Ltd., Hsin-Chu (TW)

(72) Inventors: Ming-Hua Yu, Hsin-Chu (TW); Pei-Ren Jeng, Chu-Bei (TW); Tze-Liang Lee, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 13/800,817

(22) Filed: Mar. 13, 2013

(65) Prior Publication Data

US 2014/0264590 A1 Sep. 18, 2014

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 29/66 | (2006.01) |

(52) U.S. Cl.
CPC ........ *H01L 29/7848* (2013.01); *H01L 29/6659* (2013.01); *H01L 29/7833* (2013.01); *H01L 29/785* (2013.01)
USPC .... 257/401; 257/328; 257/331; 257/E29.118; 257/E29.262; 257/E29.274

(58) Field of Classification Search
USPC .......... 257/328, 331, 401, E29.118, E29.262, 257/E29.274
See application file for complete search history.

(56) References Cited

U.S. PATENT DOCUMENTS

| 7,015,106 B2 * | 3/2006 | Yoon et al. ................... 438/283 |
| 7,723,797 B2 * | 5/2010 | Kim et al. ..................... 257/368 |
| 8,120,119 B2 * | 2/2012 | Fischer et al. ................ 257/383 |
| 8,278,718 B2 * | 10/2012 | Fischer et al. ................ 257/369 |
| 8,367,528 B2 * | 2/2013 | Bauer et al. ................... 438/507 |
| 8,546,863 B2 * | 10/2013 | Huerta et al. ................. 257/314 |
| 8,623,728 B2 * | 1/2014 | Chang et al. .................. 438/285 |
| 8,629,426 B2 * | 1/2014 | Lin et al. ......................... 257/19 |
| 2006/0208320 A1 * | 9/2006 | Tsuchiya et al. .............. 257/371 |
| 2007/0241399 A1 | 10/2007 | Irisawa et al. |
| 2008/0237641 A1 * | 10/2008 | Oh et al. ........................ 257/194 |
| 2012/0068268 A1 * | 3/2012 | Hsiao et al. ................... 257/368 |
| 2012/0168838 A1 * | 7/2012 | Marukame et al. ........... 257/295 |
| 2012/0228628 A1 * | 9/2012 | Onoda et al. .................... 257/77 |
| 2013/0001591 A1 | 1/2013 | Wu et al. |
| 2014/0054546 A1 * | 2/2014 | Liu et al. ......................... 257/24 |
| 2014/0054648 A1 * | 2/2014 | Itokawa et al. ............... 257/192 |
| 2014/0070377 A1 * | 3/2014 | Yu et al. ......................... 257/655 |
| 2014/0134818 A1 * | 5/2014 | Cheng et al. .................. 438/300 |
| 2014/0252482 A1 * | 9/2014 | Huang et al. .................. 257/349 |

FOREIGN PATENT DOCUMENTS

| JP | 2007220809 | 8/2007 |
| JP | 2012231168 | 11/2012 |
| KR | 20130007412 | 1/2013 |

* cited by examiner

*Primary Examiner* — Ida M Soward
(74) *Attorney, Agent, or Firm* — Slater & Matsil, L.L.P.

(57) ABSTRACT

A FinFET includes a substrate, a fin structure on the substrate, a source in the fin structure, a drain in the fin structure, a channel in the fin structure between the source and the drain, a gate dielectric layer over the channel, and a gate over the gate dielectric layer. At least one of the source and the drain includes a bottom SiGe layer.

20 Claims, 7 Drawing Sheets

FINFET WITH BOTTOM SIGE LAYER IN SOURCE/DRAIN

TECHNICAL FIELD

The present disclosure relates generally to a semiconductor device, more particularly a FinFET.

BACKGROUND

In some FinFET devices, weak drive current and short channel effects are challenging issues as the size of the devices is reduced. A FinFET with improved drive current and reduced short channel effects is desired.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
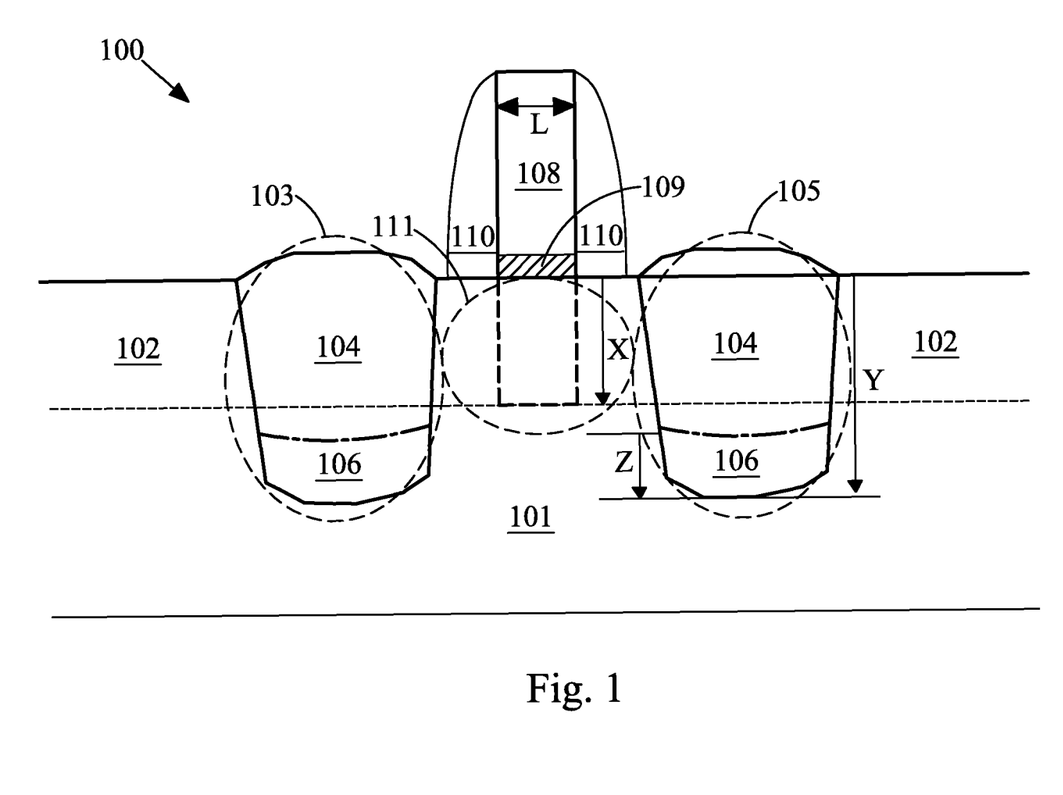
FIG. 1 is a schematic diagram of an exemplary FinFET according to some embodiments.

FIG. 1 is a schematic diagram of an exemplary FinFET 100 according to some embodiments. The FinFET 100 includes a substrate 101, a fin structure 102 formed on the substrate, a source 103 and a drain 105 formed in the fin structure 102, a channel 111 in the fin structure 102 between the source 103 and the drain 105. A gate dielectric layer 109 is formed over the channel and a gate 108 is formed over the gate dielectric layer 109. At least one of the source 103 and the drain 105 includes a bottom SiGe layer 106. Spacers 110 are formed adjacent to the gate 108. In some embodiments, the FinFET 100 can be isolated by shallow trench isolation (STI) structure (e.g., $SiO_2$, not shown) from adjacent devices.

In some embodiments, the FinFET 100 is an N-type FinFET. The substrate comprises Si or any other suitable material. The source 103 and the drain 105 include a first layer 104 comprising SiP, SiCP, or any other suitable material. The first layer 104 is disposed over the bottom SiGe layer 106. In some embodiments, the bottom SiGe layer 106 is an epitaxial layer formed at the bottom of the first layer 104 comprising SiP or SiCP. The spacers 110 comprise SiN, SiCN, SiCON, other dielectric, or any other suitable material.

In some embodiments, the volume ratio of SiGe in the bottom SiGe layer 106 to the first layer 104 (SiP or SiCP) ranges from 10% to 40%. In some embodiments, the phosphorus (P) concentration in the first layer 104 ranges from $5e20 \text{ cm}^{-3}$ to $1e22 \text{ cm}^{-3}$. In some embodiments, the first layer 104 comprises SiCP, and the carbon doping percentage ranges from 0.5% to 2%.

In some embodiments, the height X of the fin structure 102, a height Y of the source 103 or the drain 105, and a height Z of the bottom SiGe layer 106 has a relationship of $Z \leq Y - X$. In some examples, X ranges from 30 nm to 40 nm, Y ranges from 45 nm to 60 nm, Z ranges from 5 nm to 15 nm, and the gate 108 length L ranges from 15 nm to 30 nm. The top of the source 103 and the drain 105 may be 5 nm-20 nm higher than the fin structure 102 in some embodiments. The bottom of the source 103 and the drain 105 may be below the fin structure 102 in recesses formed on the substrate 101 in some embodiments. The dimension of the FinFET 100 can be varied depending on the device design and application.

Figure 2:
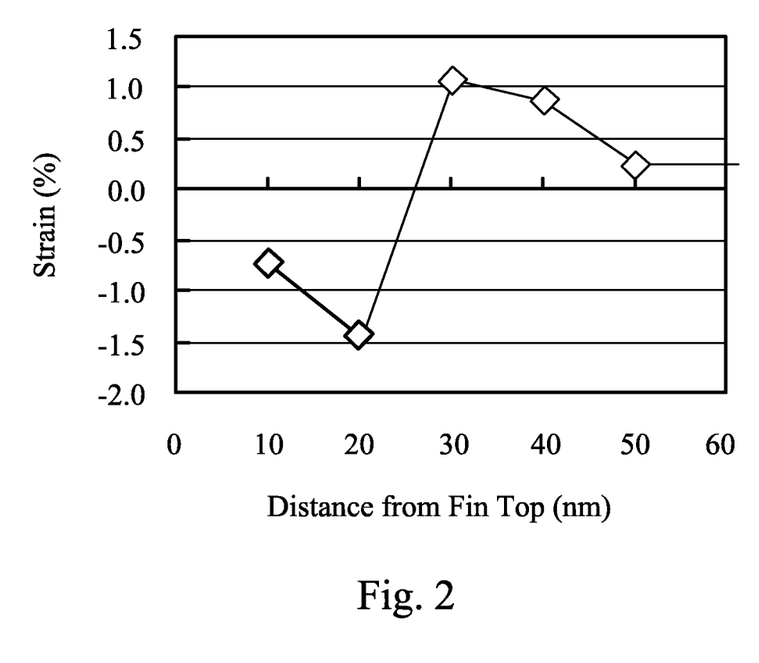
FIG. 2 is a plot of channel strain vs. distance from Fin top for the exemplary FinFET of FIG. 1 according to some embodiments.

FIG. 2 is a plot of channel strain vs. distance from Fin top for the exemplary FinFET 100 of FIG. 1 according to some embodiments. The channel 111 comprises Si and the bottom SiGe layer 106 applies compressive stress to the adjacent area (about 30 nm-40 nm from the top of the fin structure 102) of the channel 111 as shown in FIG. 2 with positive strain values). The bottom SiGe layer 106 induces tensile stress to the upper area (0 nm-20 nm from the top of the fin structure 102) of the channel 111 as shown in FIG. 2 with negative strain values). The induced tensile stress results in better mobility gain in the upper area of the channel 111.

Figure 3A:
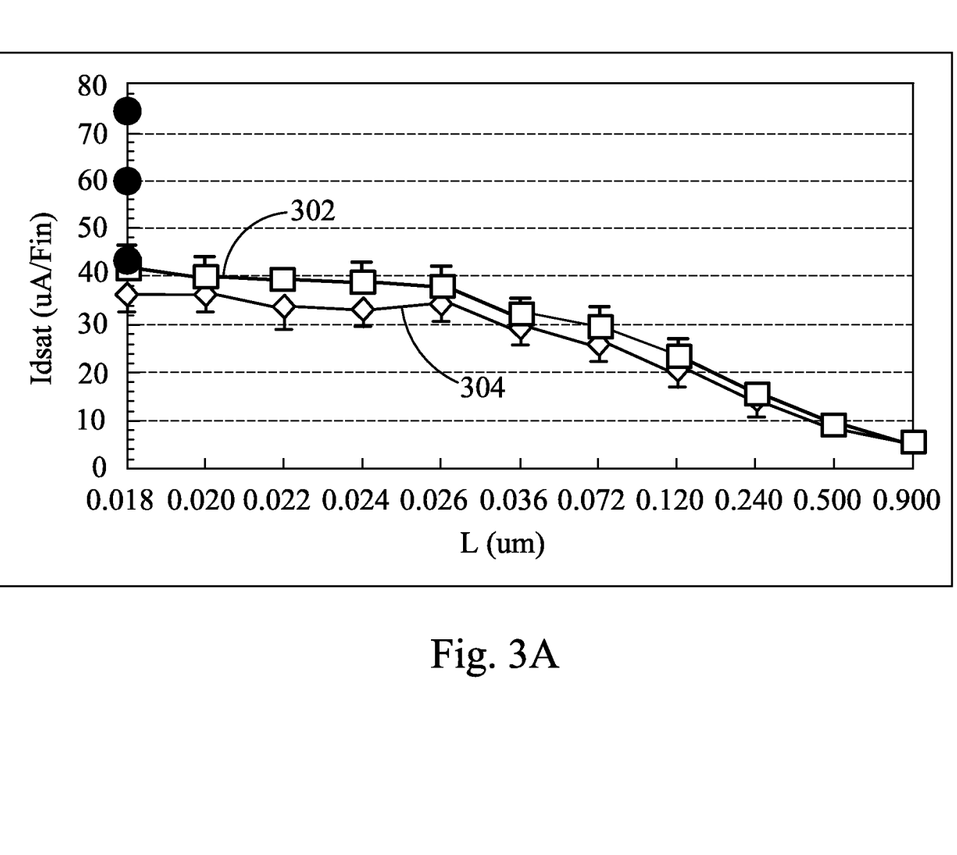
FIG. 3A is a plot of drive current vs. gate length of the exemplary FinFET in FIG. 1 according to some embodiments.

FIG. 3A is a plot of drive current vs. gate length of the exemplary FinFET 100 in FIG. 1 according to some embodiments. The curve 302 of the FinFET 100 shows improved drive current (Idsat) performance compared to the curve 304 of some other FinFET over various gate 108 length (L), resulting from better mobility gain.

Figure 3B:
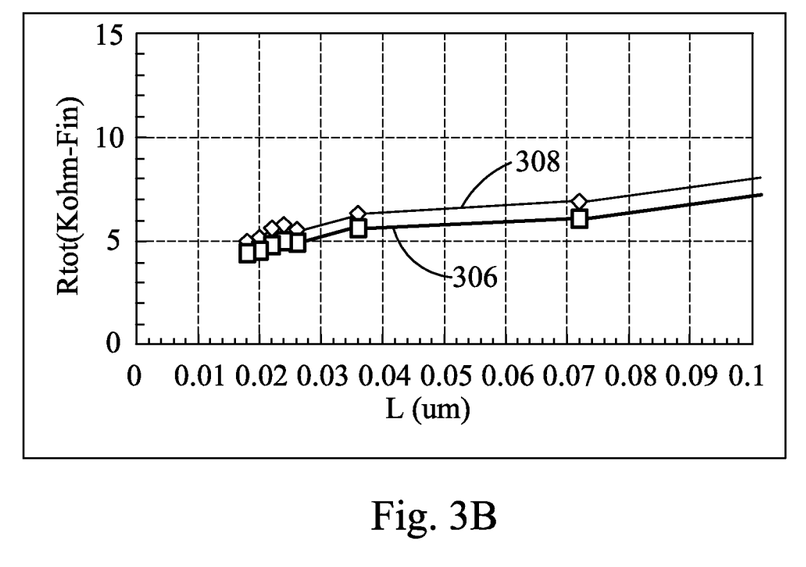
FIG. 3B is a plot of total resistance vs. gate length of the exemplary FinFET in FIG. 1 according to some embodiments.

FIG. 3B is a plot of total resistance vs. gate length of the exemplary FinFET 100 in FIG. 1 according to some embodiments. The total resistance (Rtot) is the sum of channel resistance and contact resistance. The curve 306 of the FinFET 100 shows reduced total resistance (Rtot) compared to the curve 308 of some other FinFET over various gate 108 length (L).

Thus, the FinFET 100 shows improved performance to overcome short channel effects, while having a high doping concentration of phosphorus for an N-type device in some embodiments. The phosphorus (P) concentration of the first layer 104 ranges from $5e20 \text{ cm}^{-3}$ to $1e22 \text{ cm}^{-3}$ in some embodiments. In some embodiments, the phosphorus (P) concentration of the first layer 104 ranges from 1e21 cm$^{-3}$ to 4e21 cm$^{-3}$.

Figure 4:
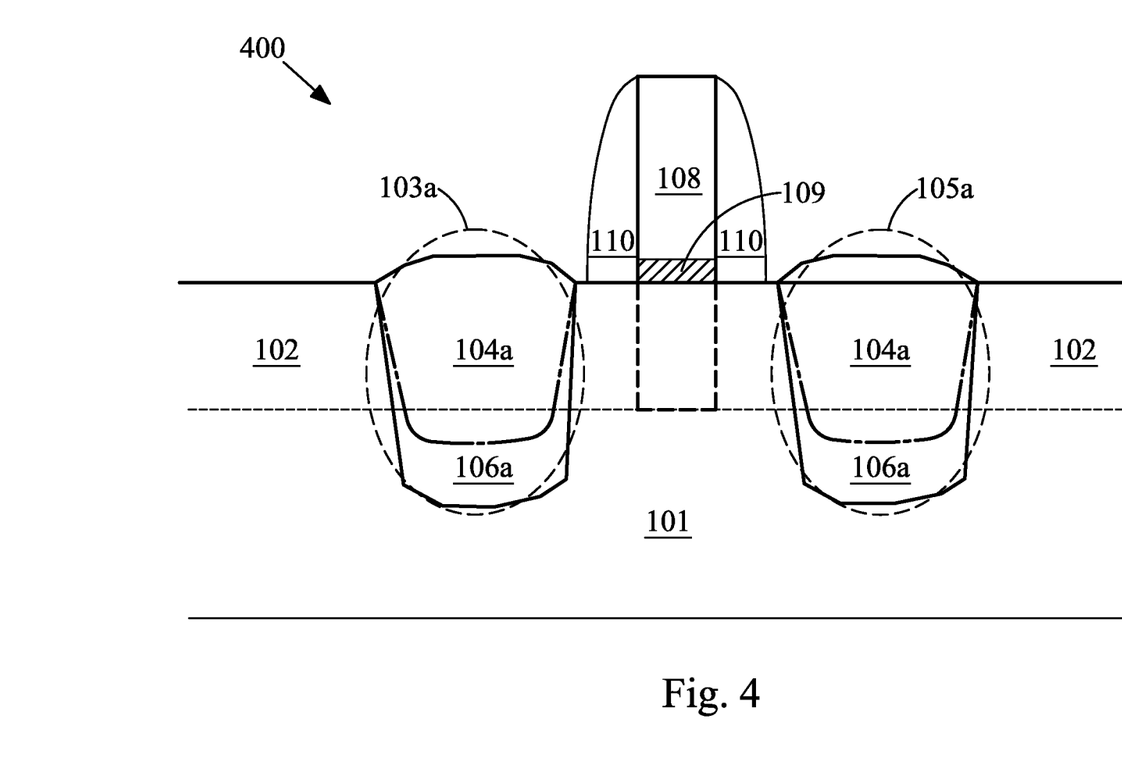
FIG. 4 is a schematic diagram of another exemplary FinFET according to some embodiments.

FIG. 4 is a schematic diagram of another exemplary FinFET 400 according to some embodiments. The FinFET 400 is similar to the FinFET 100 in FIG. 1 and at least one of the source 103a and the drain 105a includes a SiGe layer 106a. The source 103a/drain 105a of the FinFET 400 includes a sidewall SiGe layer in addition to the bottom SiGe layer to form the SiGe layer 106a. In some embodiments, an epitaxial SiGe layer 106a is formed to the sidewall and bottom of the first layer 104a comprising SiP or SiCP.

Figure 5:
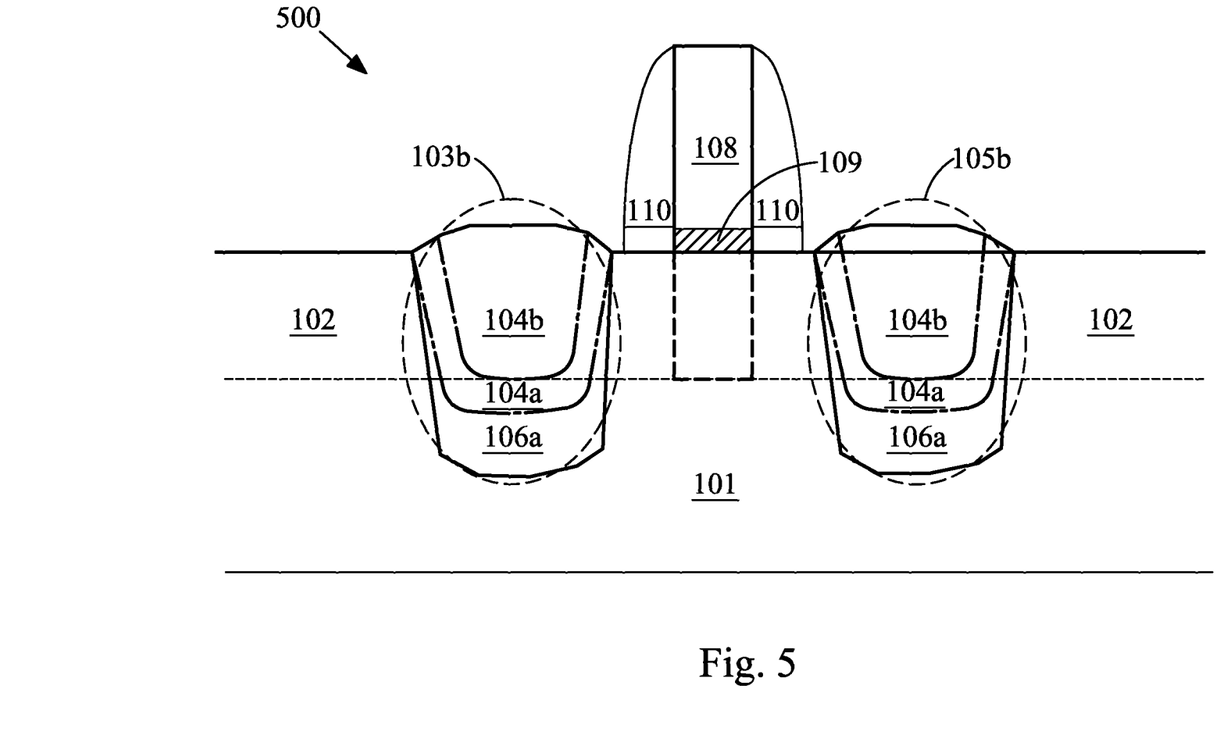
FIG. 5 is a schematic diagram of yet another exemplary FinFET according to some embodiments.

FIG. 5 is a schematic diagram of yet another exemplary FinFET according to some embodiments. The FinFET 500 is similar to the FinFET 400 in FIG. 4 and at least one of the source 103b and the drain 105b includes a SiGe layer 106a. The source 103b/drain 105b of the FinFET 500 includes a sidewall SiGe layer in addition to the bottom SiGe layer to form the SiGe layer 106a.

In addition, the source 103b/the drain 105b of the FinFET 500 further comprise a second layer 104b over the first layer 104a. The second layer 104b has a higher dopant concentration than the first layer 104a. In some embodiments, the first layer 104a and the second layer 104b comprise SiP or SiCP, and the first layer 104a has a phosphorus concentration ranging from 5e20 cm$^{-3}$ to 2e21 cm$^{-3}$, while the second layer 104b has a phosphorus concentration ranging from 1e21 cm$^{-3}$ to 1e22 cm$^{-3}$.

In some examples, the first layer 104a has a phosphorus concentration ranging from 7e20 cm$^{-3}$ to 1e21 cm$^{-3}$, while the second layer 104b has a phosphorus concentration ranging from 1e21 cm$^{-3}$ to 4e21 cm$^{-3}$. In some embodiments, the first layer 104a and the second layer 104b comprise SiCP, and the carbon doping percentage ranges from 0.5% to 2%.

Figure 6A:
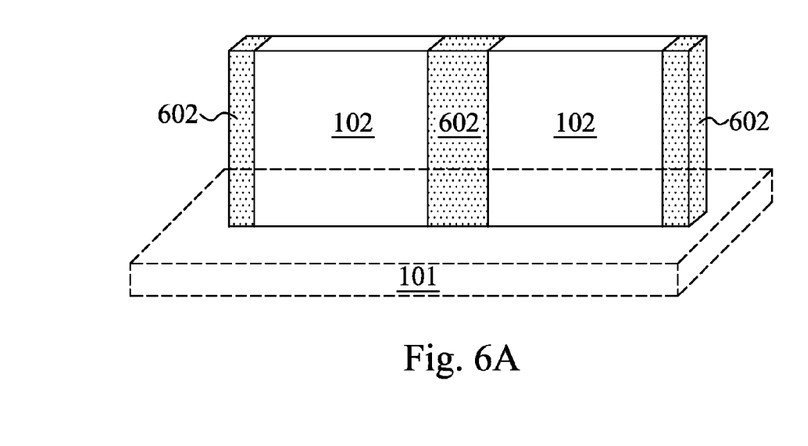
FIGS. 6A-6E are intermediate steps of fabricating the exemplary FinFET in FIG. 4 according to some embodiments.

FIGS. 6A-6E are intermediate steps of fabricating the exemplary FinFET in FIG. 4 according to some embodiments. In FIG. 6A, a fin structure 102 and shallow trench isolation structure 602 are formed on a substrate 101 by dry etching and chemical vapor deposition (CVD), for example. (The substrate 101 is not shown in subsequent steps for simplicity.) In some embodiments, the substrate 101 comprises Si and the STI comprises SiO$_2$.

Figure 6B:
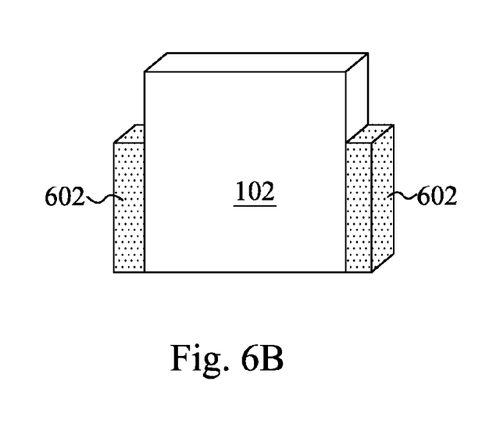

In FIG. 6B, the STI is etched by wet etching using hydrogen chloride to form the fin structure 102, for example.

Figure 6C:
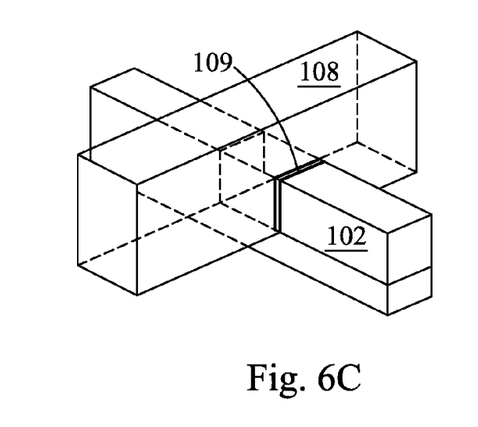

In FIG. 6C, the gate dielectric layer 109 and the gate 108 are formed. For example, the gate dielectric layer 109 such as SiO$_2$ or any other suitable material can be formed by a high temperature CVD. The gate 108 such as polysilicon or metal can be formed by CVD or atomic layer (AL) CVD.

Figure 6D:
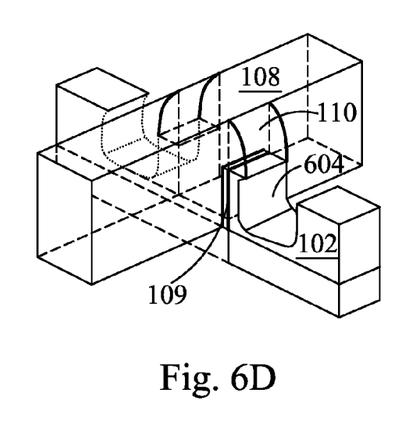

In FIG. 6D, spacers 110 (e.g., SiN) adjacent to the gate 108 are formed by depositing SiN using ALCVD or high temperature CVD and recesses 604 in the fin structure 102 (and in the substrate 101) are etched by plasma etching, for example.

Figure 6E:
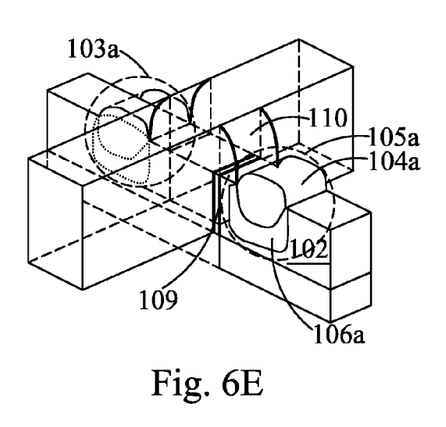

In FIG. 6E, the source 103a and the drain 105a are formed. For example, the SiGe layer 106a (including bottom SiGe and sidewall SiGe) is deposited by CVD. Then the first layer 104a (e.g., SiP) is deposited by CVD.

Even though the FinFET 400 in FIG. 4 is shown for the exemplary fabrication steps in FIGS. 6A-6E, the FinFET 100 in FIG. 1 and the FinFET 500 in FIG. 5 can be fabricated in similar steps.

According to some embodiments, a FinFET includes a substrate, a fin structure on the substrate, a source in the fin structure, a drain in the fin structure, a channel in the fin structure between the source and the drain, a gate dielectric layer over the channel, and a gate over the gate dielectric layer. At least one of the source and the drain includes a bottom SiGe layer.

According to some embodiments, a method for forming a FinFET includes forming a fin structure on a substrate. A source and a drain are formed and at least one of the source and the drain includes a bottom SiGe layer. A gate dielectric layer is formed over a channel between the source and the drain. A gate is formed over the gate dielectric layer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A FinFET, comprising:
a substrate having a major surface;
a fin structure on the substrate, the fin extending from the major surface and having a topmost surface;
a source in the fin structure, the source extending below the topmost surface of the fin;
a drain in the fin structure, the drain extending below the topmost surface of the fin;
a channel in the fin structure between the source and the drain;
a gate dielectric layer over the channel; and
a gate over the gate dielectric layer,
wherein at least one of the source and the drain includes a bottom SiGe layer.

2. The FinFET of claim 1, further comprising a sidewall SiGe layer in the at least one of the source or the drain.

3. The FinFET of claim 1, wherein the source and the drain include a first layer comprising SiP or SiCP, and the first layer is disposed over the bottom SiGe layer.

4. The FinFET of claim 3, wherein a volume ratio of SiGe to SiP or SiGe to SiCP ranges from 10% to 40%.

5. The FinFET of claim 3, wherein a phosphorus concentration of the first layer ranges from 5e20 cm$^{-3}$ to 1e22 cm$^{-3}$.

6. The FinFET of claim 3, wherein the first layer comprises SiCP and a carbon doping percentage of the first layer ranges from 0.5% to 2%.

7. The FinFET of claim 3, wherein the source and the drain further comprises a second layer comprising SiP or SiCP, the second layer is disposed over the first layer, and the second layer has a higher phosphorus concentration than the first layer.

8. The FinFET of claim 7, wherein the first layer has a phosphorus concentration ranging from 5e20 cm$^{-3}$ to 2e21 cm$^{-3}$.

9. The FinFET of claim 7, wherein the second layer has a phosphorus concentration ranging from 1e21 cm$^{-3}$ to 1e22 cm$^{-3}$.

10. The FinFET of claim 1, wherein a height X of the fin structure, a height Y of the source or the drain, and a height Z of the bottom SiGe layer has a relationship of Z≤Y−X.

11. The FinFET of claim 1, further comprising spacers adjacent to the gate.

12. The FinFET of claim 11, wherein the spacers comprise SiN, SiCN, or SiCON.

13. A method for forming a FinFET, comprising:
   forming a fin structure extending from and above a major surface of a substrate;
   recessing a source region into the fin and a drain region into the fin;
   forming a source and a drain in the fin, wherein at least one of the source and the drain includes a bottom SiGe layer formed in a bottom portion of the source region or the drain region;
   forming a gate dielectric layer over a channel between the source and the drain; and
   forming a gate over the gate dielectric layer.

14. The method of claim 13, wherein forming the source and the drain includes forming a sidewall SiGe layer in the at least one of the source or the drain.

15. The method of claim 13, wherein forming the source and the drain comprises forming a first layer comprising SiP or SiCP, and the first layer is disposed over the bottom SiGe layer.

16. The method of claim 15, wherein a phosphorus concentration of the first layer ranges from 5e20 cm$^{-3}$ to 1e22 cm$^{-3}$.

17. The method of claim 15, wherein forming the source and the drain further comprises forming a second layer over the first layer, the second layer comprises SiP or SiCP, and the second layer has a higher phosphorus concentration than the first layer.

18. The method of claim 17, wherein the first layer has a phosphorus concentration ranging from 5e20 cm$^{-3}$ to 2e21 cm$^{-3}$ and the second layer has a phosphorus concentration ranging from 1e21 cm$^{-3}$ to 1e22 cm$^{-3}$.

19. The method of claim 13, further comprising forming spacers adjacent to the gate.

20. A FinFET, comprising:
   a substrate;
   a fin structure on the substrate;
   a source in the fin structure;
   a drain in the fin structure;
   a channel in the fin structure between the source and the drain;
   a gate dielectric layer over the channel; and
   a gate over the gate dielectric layer,
   wherein at least one of the source and the drain includes a top layer comprising SiP or SiCP, a bottom SiGe layer, and a sidewall SiGe layer.

* * * * *

UNITED STATES PATENT AND TRADEMARK OFFICE
CERTIFICATE OF CORRECTION

PATENT NO. : 8,963,258 B2
APPLICATION NO. : 13/800817
DATED : February 24, 2015
INVENTOR(S) : Ming-Hua Yu It is certified that error appears in the above-identified patent and that said Letters Patent is hereby corrected as shown below:

In the Claims

In Col. 5, line 14, claim 13, delete "fonning" and insert --forming--.

Signed and Sealed this
Second Day of June, 2015

Michelle K. Lee
*Director of the United States Patent and Trademark Office*